United States Patent
Liu et al.

(10) Patent No.: US 9,748,175 B1
(45) Date of Patent: Aug. 29, 2017

(54) CONDUCTIVE STRUCTURE IN SEMICONDUCTOR STRUCTURE AND METHOD FOR FORMING THE SAME

(71) Applicant: Taiwan Semiconductor Manufacturing Co., Ltd., Hsinchu (TW)

(72) Inventors: Yi-Jung Liu, Hsinchu (TW); Huan-Wei Wu, New Taipei (TW); Chester Tang, Kaohsiung (TW); Joung-Wei Liou, Zhudong Township, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/355,349

(22) Filed: Nov. 18, 2016

(51) Int. Cl.
| | |
|---|---|
| *H01L 21/31* | (2006.01) |
| *H01L 23/532* | (2006.01) |
| *H01L 21/02* | (2006.01) |
| *H01L 21/768* | (2006.01) |
| *H01L 23/522* | (2006.01) |
| *H01L 23/528* | (2006.01) |
| *C09D 5/00* | (2006.01) |
| *C09D 5/24* | (2006.01) |

(52) U.S. Cl.
CPC .......... *H01L 23/5329* (2013.01); *C09D 5/008* (2013.01); *C09D 5/24* (2013.01); *H01L 21/02118* (2013.01); *H01L 21/02203* (2013.01); *H01L 21/76816* (2013.01); *H01L 21/76877* (2013.01); *H01L 23/5226* (2013.01); *H01L 23/5283* (2013.01)

(58) Field of Classification Search
CPC ....... H01L 21/02126; H01L 21/002216; H01L 21/3121; H01L 23/296; H01L 23/5384
USPC .................. 438/761, 763; 257/743, 744, 750
See application file for complete search history.

(56) References Cited

U.S. PATENT DOCUMENTS

| | | | |
|---|---|---|---|
| 2005/0064698 A1* | 3/2005 | Chang ............... | H01L 21/02126 438/623 |
| 2009/0085170 A1* | 4/2009 | Imada ................. | H01L 21/3105 257/629 |
| 2009/0093100 A1* | 4/2009 | Xia ....................... | C23C 16/325 438/421 |
| 2009/0093132 A1* | 4/2009 | Xu .......................... | C23C 16/22 438/780 |
| 2009/0096106 A1* | 4/2009 | Vrtis ....................... | C23C 16/30 257/759 |

* cited by examiner

*Primary Examiner* — S. V. Clark
(74) *Attorney, Agent, or Firm* — Birch, Stewart, Kolasch & Birch, LLP

(57) ABSTRACT

A method for manufacturing a semiconductor structure is provided. The method for manufacturing a semiconductor structure includes forming an organosilicon layer over a substrate and etching the organosilicon layer to have a trench. The method for manufacturing a semiconductor structure further includes forming a conductive structure in the trench. In addition, the organosilicon layer is made of a material including Si—C bonding and Si—O bonding, and a ratio of an amount of the Si—C bonding to an amount of the Si—O bonding is greater than about 0.2.

20 Claims, 4 Drawing Sheets

CONDUCTIVE STRUCTURE IN SEMICONDUCTOR STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

Over the past several decades, the semiconductor integrated circuit industry has experienced rapid growth. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

Although existing processes for manufacturing semiconductor structures have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
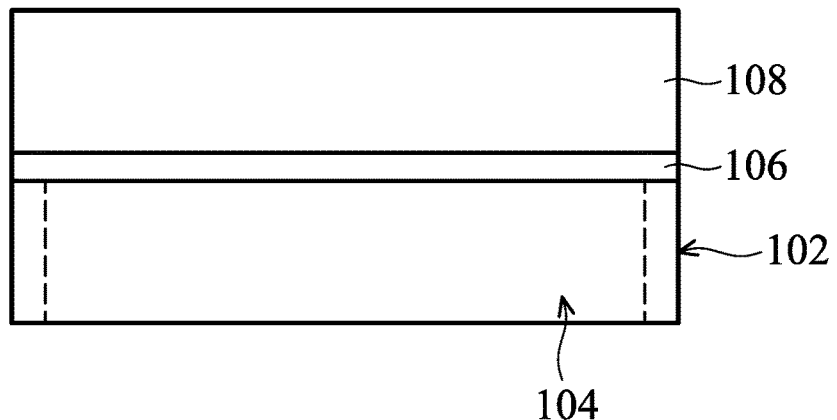
FIGS. 1A to 1D are cross-sectional representations of various stages of forming a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments for forming a semiconductor structure are provided. The semiconductor structure includes a carbon-rich organosilicon layer and a conductive structure formed in the carbon-rich organosilicon layer. Since the organosilicon layer is carbon-rich, its dielectric constant can remain relatively low even after being etched in subsequent processes.

FIGS. 1A to 1D are cross-sectional representations of various stages of forming a semiconductor structure 100 in accordance with some embodiments. As shown in FIG. 1A, a substrate 102 is received in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and diamond. Examples of the compound semiconductor materials may include, but are not limited to, silicon carbide, gallium arsenic, gallium phosphide, indium phosphide, indium arsenide, and indium antimonide. Examples of the alloy semiconductor materials may include, but are not limited to, SiGe, GaAsP, AlInAs, AlGaAs, GaInAs, GaInP, and GaInAsP.

In addition, the substrate 102 may include structures such as doped regions, interlayer dielectric (ILD) layers, conductive features, and/or isolation structures. Furthermore, the substrate 102 may further include single or multiple material layers to be patterned. For example, the material layers may include a silicon layer, a dielectric layer, and/or a doped poly-silicon layer.

In some embodiments, the substrate 102 includes a device region 104, as shown in FIG. 1A. The device region 104 may have various device elements. Examples of device elements may include, but are not limited to, transistors, diodes, and other applicable elements. Examples of the transistors may include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like. Various processes are performed to form the device elements, such as deposition, etching, implantation, photolithography, annealing, and other applicable processes.

A first etch stop layer 106 is formed over the substrate 102, as shown in FIG. 1A in accordance with some embodiments. In some embodiments, the first etch stop layer 106 is made of silicon nitride, silicon oxynitride, or other applicable materials. In some embodiments, the first etch stop layer 106 is formed by performing a plasma enhanced chemical vapor deposition (CVD) process, a low pressure CVD process, an atomic layer deposition (ALD) process, or other applicable processes.

After the first etch stop layer 106 is formed, a first organosilicon layer 108 is formed over the first etch stop layer 106, as shown in FIG. 1A in accordance with some embodiments. In some embodiments, the first organosilicon layer 108 is an interlayer dielectric layer or an intermetal dielectric layer.

In some embodiments, the first organosilicon layer 108 is made of an organosilicon material including Si—C bonding and Si—O bonding. In some embodiments, the amount of the Si—C bonding in the organosilicon material is relatively high, so that the first organosilicon layer 108 is a carbon-rich layer. In some embodiments, the ratio of the amount of the Si—C bonding to the amount of Si—O bonding in the organosilicon material is greater than about 0.2. In some embodiments, the ratio of the amount of Si—C bonding to the amount of Si—O bonding in the organosilicon material is in a range from about 0.2 to about 0.25. In some embodiments, the organosilicon material is $Si_xC_yO_z$, in which x, y, and z are positive integral. In some embodiments, y:x is in a range from about 0.5 to about 1.5. In some embodiments, z:x is in a range from about 1.5 to about 2.5. In some embodiments, y:z is in a range from about 0.25 to about 1.

When the amount of carbons in the first organosilicon layer 108 is relatively high, the dielectric constant of the first organosilicon layer 108 can remain low, even when some carbons in the first organosilicon layer 108 are removed during the subsequent etching process.

In some embodiments, the dielectric constant of the first organosilicon layer 108 is in a range from about 2.71 to about 2.96. As described above, the dielectric constant of the first organosilicon layer 108 can remain low even after performing an etching process. Therefore, although the dielectric constant of the first organosilicon layer 108 may not be lower than that of the low-carbon dielectric material, since the dielectric constant of the first organosilicon layer 108 will not increase as much as the low-carbon dielectric material does, the first organosilicon layer 108 can be used in, for example, an interconnect structure and has an improved performance.

In some embodiments, the first organosilicon layer is formed by depositing an organosilicon material over the first etch stop layer 106. As described previously, the first organosilicon layer 108 may be a carbon-rich low dielectric material. In some embodiment, after the organosilicon material is deposited over the first etch stop layer 106, the organosilicon material is etched to form a trench without performing a curing process first. In some embodiments, the organosilicon material is formed by performing a chemical vapor deposition (CVD) process, a physical vapor deposition (PVD) process, an atomic layer deposition (ALD) process, a spin-on coating process, or other applicable processes.

In some embodiments, the organosilicon material is formed by depositing a precursor material over the first etch stop layer 106 over the substrate 102, and curing the precursor material to form the first organosilicon layer 108 afterwards. In some embodiments, the precursor material is formed by performing a chemical vapor deposition (CVD) process, a physical vapor deposition (PVD) process, an atomic layer deposition (ALD) process, a spin-on coating process, or other applicable processes.

In some embodiments, the precursor material includes an organosilicon material described above and a $C_3$ to $C_5$ cyclic compound. In addition, the $C_3$ to $C_5$ cyclic compound is removed during the curing process, so that a number of pores are formed in the resulting first organosilicon layer 108.

Figure 2:
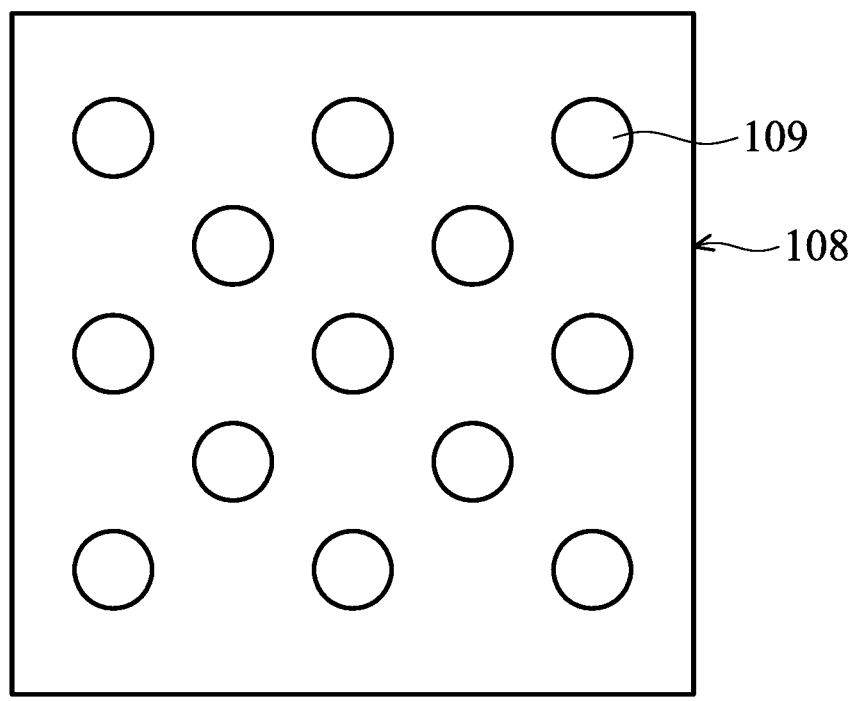
FIG. 2 shows a representation of the first organosilicon layer 108 in accordance with some embodiments.

FIG. 2 shows a representation of the first organosilicon layer 108 formed after the $C_3$ to $C_5$ cyclic compound is removed in accordance with some embodiments. As shown in FIG. 2, pores 109 are formed in the first organosilicon layer 108 after the precursor material is cured and the $C_3$ to $C_5$ cyclic compound is removed. More specifically, when the precursor material is cured (e.g. heated), the $C_3$ to $C_5$ cyclic compound will be released from the precursor material and left the pores 109 in the resulting first organosilicon layer 108. In some embodiments, when the $C_3$ to $C_5$ cyclic compound is released from the precursor material, channels, which are connected with the pores 109, are also formed in the first organosilicon layer 108. The formation of the pores 109 and the channels may reduce the dielectric constant of the resulting first organosilicon layer 108.

Since the pores 109 are formed by releasing the $C_3$ to $C_5$ cyclic compound from the precursor material, the size of one pore 109 is substantially equal to the size of the $C_3$ to $C_5$ cyclic compound. Therefore, the size of the pore 109 in the first organosilicon layer 108 can be controlled by adjusting the size of the $C_3$ to $C_5$ cyclic compound mixed in the precursor material. In some embodiments, the size of the cyclic compound should be large enough to form pores in the first organosilicon layer 108 but should not be too large or etchants used in subsequent etching processes may enter the large pores 109, resulting in damaging the first organosilicon layer 108.

In some embodiments, the ratio of the amount of the organosilicon material to the amount of the $C_3$ to $C_5$ cyclic compound in the precursor material is in a range from about 0.3 to about 6. In some embodiments, the flow rate of the organosilicon material is in a range from about 50 mg/min to about 3000 mg/min. In some embodiments, the flow rate of the $C_3$ to $C_5$ cyclic compound in the precursor material is smaller than about 3000 mg/min. As described above, the amount of $C_3$ to $C_5$ cyclic compound in the precursor material should be high enough so that the number of pores 109 formed in the resulting first organosilicon layer 108 can be high enough. On the other hand, the amount of $C_3$ to $C_5$ cyclic compound in the precursor material should not be too high, or too many pores 109 may be formed in the first organosilicon layer 108, and the first organosilicon layer 108 risks becoming damaged in subsequent etching processes.

In some embodiments, the $C_3$ to $C_5$ cyclic compound includes substituted or non-substituted $C_3$ to $C_5$ cycloalkane, substituted or non-substituted $C_3$ to $C_5$ cycloalkene, or combinations thereof. In some embodiments, the $C_3$ to $C_5$ cyclic compound includes substituted or non-substituted cyclopropane, substituted or non-substituted cyclobutane, substituted or non-substituted cyclopentane, substituted or non-substituted cyclobutene, substituted or non-substituted cyclopentene, or combinations thereof. In some embodiments, the substituents of the $C_3$ to $C_5$ cyclic compound includes halogen, hydroxyl, alkoxy, aryloxyl, amino, alkylamino, arylamino, dialkylamino, diarylamino, imino, alkylimino, arylimino, acylamido, diacylamido, acylimido, cyano, nitro, mercapto, carbamido, carbamoyl, carboxyl, thioureido, thiocyanato, sulfonamido, thio, sulfonyl or sulfinyl groups.

Figure 1B:
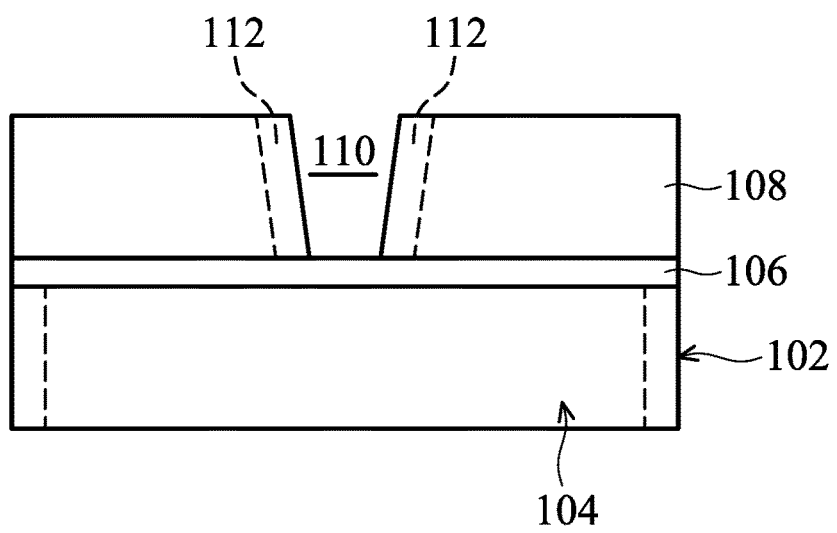

After the first organosilicon layer 108 is formed, a trench 110 is formed in the first organosilicon layer 108, as shown in FIG. 1B in accordance with some embodiments. In some embodiments, the trench 110 is formed by forming a mask over the first organosilicon layer 108 and etching the first organosilicon layer 108 through an opening of the mask. In some embodiments, the first organosilicon layer 108 is etched by performing a dry etching process and/or a wet etching process, and the etching process stops when the first etch stop layer 106 is exposed.

During the etching process, some carbons in the first organosilicon layer 108 may also be removed. In some embodiments, some carbons located at the sidewalls of the trench 110 in the first organosilicon layer 108 (e.g. in sidewall region 112) are removed during the etching process. However, as described above, since the first organosilicon layer 108 is a carbon-rich layer, the dielectric constant of the first organosilicon layer 108 may still be relatively low even when some carbons therein are removed during the etching process.

In addition, when the first organosilicon layer 108 is made of the carbon-rich material, the size and the shape of the trench 110 formed in the first organosilicon layer 108 can have a better control. In some embodiments, the trench 110 has a wide top surface and a narrow bottom surface, as shown in FIG. 1B in accordance with some embodiments. In some embodiments, the conductive structure has a first width at its top surface and has a second width at its bottom surface, and the ratio of the first width to the second width is smaller than 1.4. As described above, the first organosilicon layer 108 is made of the carbon-rich material and therefore can be less damaged during the etching process, especially at its top surface. Accordingly, the ratio of the first width to the second width can be formed as designed (e.g. relatively low), reducing the risk of short-circuits.

Figure 1C:
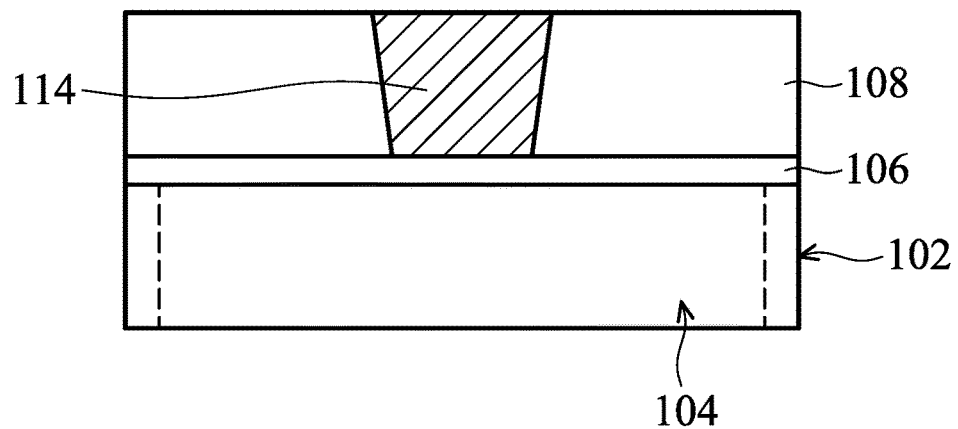

After the trench 110 is formed in the first organosilicon layer 108, a first conductive structure 114 is formed in the trench 110, as shown in FIG. 1C in accordance with some embodiments. The first conductive structure 114 may be formed by forming a conductive material in the trench 110 and over the first organosilicon layer 108 and removing the conductive material located over the first organosilicon layer 108 afterwards.

In some embodiments, the conductive material is copper. In some embodiments, the conductive material is aluminum, copper, tungsten, titanium, tantalum, titanium nitride, tantalum nitride, nickel silicide, cobalt silicide, TaC, TaSiN, TaCN, TiAl, TiAlN, or other applicable materials. In some embodiments, the conductive material is formed by performing a spin-on coating process, a CVD process, a PVD process, or other applicable deposition or coating processes.

After the conductive material is formed, a polishing process is performed over the substrate 102 to form the first conductive structure 114, as shown in FIG. 1C in accordance with some embodiments. In some embodiments, the polishing process is a chemical mechanical polishing process. In some embodiments, the polishing process is performed until the top surface of the first organosilicon layer 108 is exposed. The first organosilicon layer 108 and the first conductive structure 114 can be seen as a first metal layer.

Figure 1D:
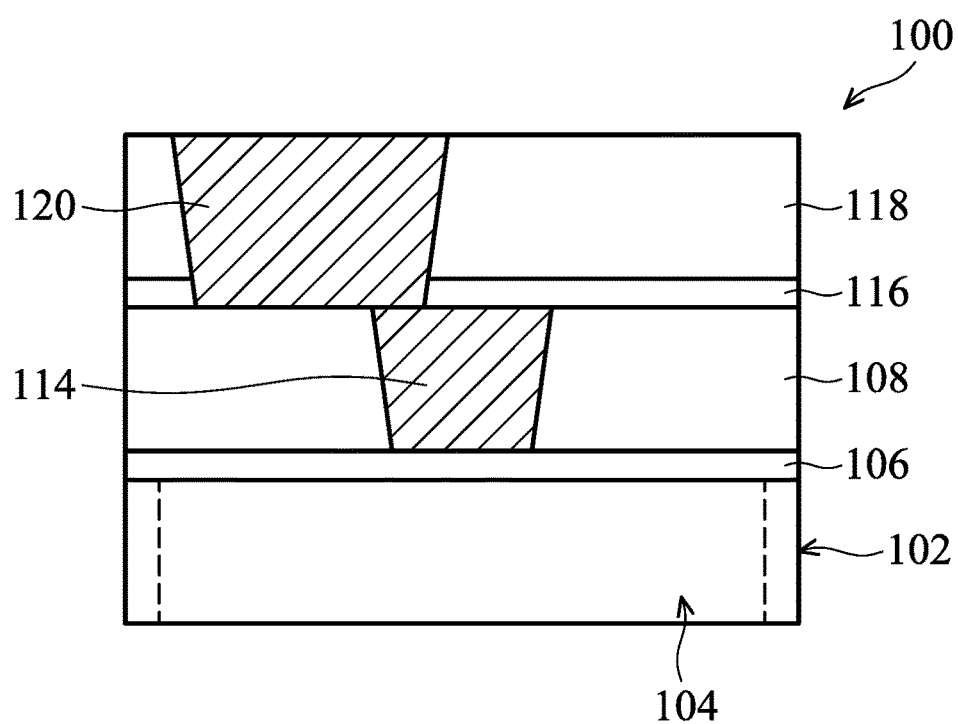

After the first conductive structure is formed in the first organosilicon layer 108, a second metal layer may be formed over the first organosilicon layer 108, as shown in FIG. 1D in accordance with some embodiments. The second metal layer may include a second etch stop layer 116, a second organosilicon layer 118, and a second conductive structure 120.

Processes and materials used to form the second etch stop layer 116, the second organosilicon layer 118, and the second conductive structure 120 may be similar to, or the same as, those used to form the first etch stop layer 106, the first organosilicon layer 108, and the first conductive structure 114, and the same or similar features may not be repeated herein.

More specifically, the second etch stop layer 116 is formed over the first organosilicon layer 108, and the second organosilicon layer 118 is formed over the second etch stop layer 116, as shown in FIG. 1D in accordance with some embodiments. The materials used to form the second etch stop layer 116 may be similar to, or the same as, those used to form the first etch stop layer 106, and the materials used to form the second organosilicon layer 118 may be similar to, or the same as, those used to form the first organosilicon layer 108.

After the second etch stop layer 116 and the second organosilicon layer 118 are formed, the second conductive structure 120 is formed in the second etch stop layer 116 and the second organosilicon layer 118, as shown in FIG. 1D in accordance with some embodiments. The second conductive structure 120 may be formed by forming a trench in the second etch stop layer 116 and the second organosilicon layer 118 and filling the trench with a conductive material. The conductive materials used to form the second conductive structure 120 may be similar to, or the same as, those used to form the first conductive structure 114. As show in FIG. 1D, the second conductive structure 120 is electrically connected with the first conductive structure 114 in accordance with some embodiments.

As described previously, the semiconductor structure 100 includes the first organosilicon layer 108 and the second organosilicon layer 118, which are made of the carbon-rich low dielectric material. Therefore, when the first conductive structure 114 and the second conductive structure 120 are formed in the first organosilicon layer 108 and the second organosilicon layer 118, the shapes and the sizes of the first conductive structure 114 and the second conductive structure 120 can be better controlled.

In addition, since the first organosilicon layer 108 and the second organosilicon layer 118 are carbon-rich, the dielectric constant of the first organosilicon layer 108 and the second organosilicon layer 118 can remain relatively low even when some carbons therein are removed during the subsequent etching processes. Accordingly, the performance of the semiconductor structure 100 can be improved.

Figure 3:
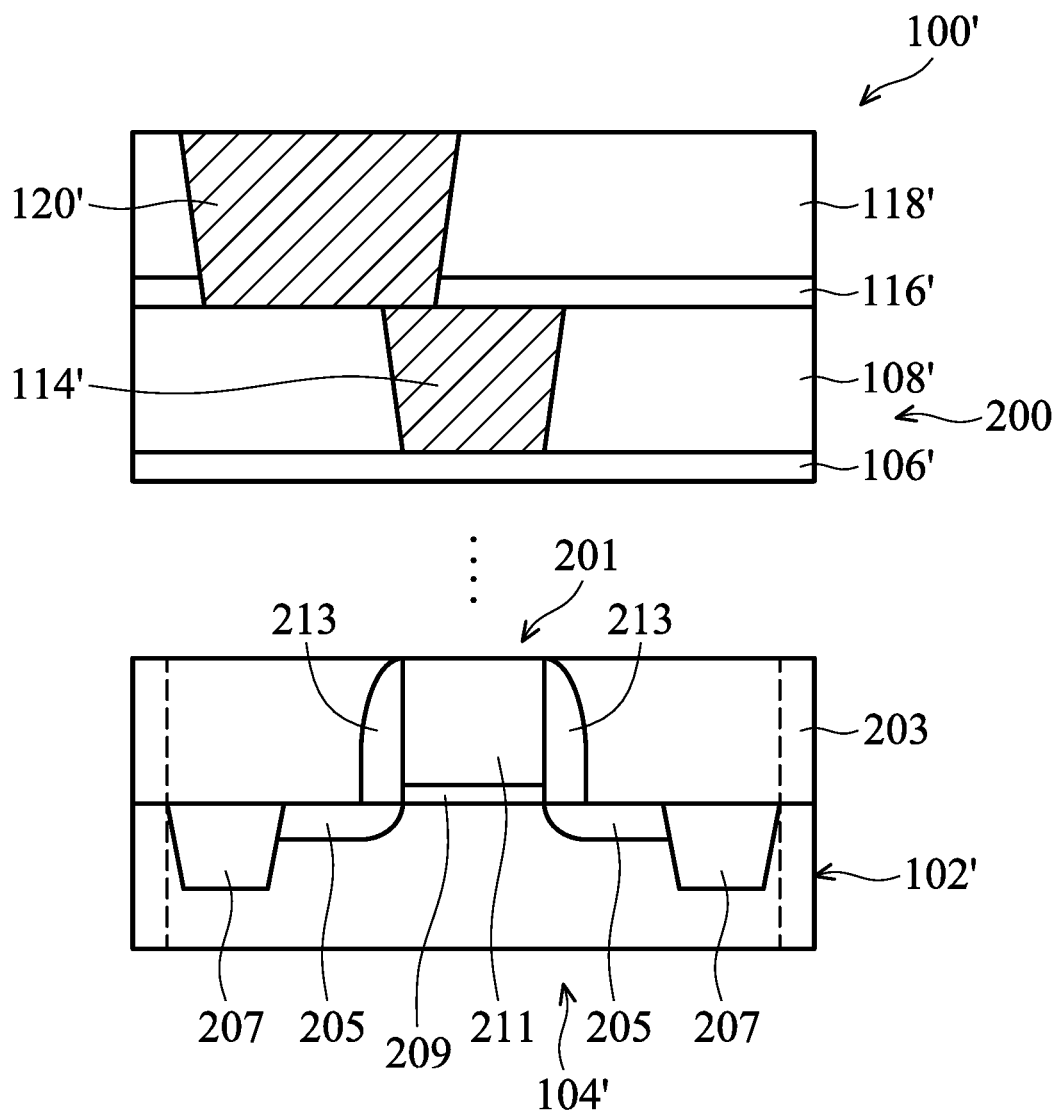
FIG. 3 is a cross-sectional representation of a semiconductor structure in accordance with some embodiments.

FIG. 3 is a cross-sectional representation of a semiconductor structure 100' in accordance with some embodiments. The semiconductor structure 100' includes an interconnect structure 200 formed over a substrate 102'. In addition, the substrate 102' includes a device region 104' in accordance with some embodiments. In some embodiments, the device region 104' includes a gate structure 201 embedded in an interlayer dielectric (ILD) layer 203, source/drain regions 205, and isolation structures 207.

In some embodiments, the gate structure 201 includes a gate dielectric layer 209, a gate electrode 211, and spacers 213. In some embodiments, the gate dielectric layer 209 is made of high k dielectric materials, such as metal oxides, metal nitrides, metal silicates, transition metal oxides, transition metalnitrides, transition metalsilicates, oxynitrides of metals, or metal aluminates. Examples of the high k dielectric materials may include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, zirconium oxide, titanium oxide, aluminum oxide, or hafnium dioxide-alumina ($HfO_2$—$Al_2O_3$) alloy.

In some embodiments, the gate electrode 211 is made of a conductive material, such as aluminum, copper, tungsten, titanium, tantalum, titanium nitride, tantalum nitride, nickel silicide, cobalt silicide, TaC, TaSiN, TaCN, TiAl, TiAlN, or other applicable materials.

The ILD layer 203 may include multilayers made of multiple dielectric materials, such as silicon oxide, silicon nitride, phosphosilicate glass (PSG), borophosphosilicate glass (BPSG), a low-k dielectric material, and/or other applicable dielectric materials. In some embodiments, the ILD layer 203 is made of an organosilicon material layer. In some embodiments, the materials used to form the ILD layer 203 is the same, or similar to, those used to form first organosilicon layer 108 described previously. The ILD layer 203 may be formed by chemical vapor deposition (CVD), physical vapor deposition, (PVD), atomic layer deposition (ALD), spin-on coating, or other applicable processes.

It should be noted that the device region 104' shown in FIG. 3 is merely an example, and other devices may be additionally or alternatively formed in the device region 104'. In addition, some dielectric layers and conductive features may have been omitted in FIG. 3 for clarity.

The interconnect structure 200 may include a number of metal layers formed over the device region 104' of the substrate 102'. In some embodiments, the interconnect structure 200 includes a first conductive structure 114' formed in a first organosilicon layer 108' and a second conductive structure 120' formed in a second organosilicon layer 118'. The processes and materials used to form the first organosilicon layer 108' and the second organosilicon layer 118' may be similar to, or the same as, those used to form the first organosilicon layer 108 and the second organosilicon layer 118. The processes and materials used to form the first conductive structure 114' and the second conductive structure 120' may be similar to, or the same as, those used to form the first conductive structure 114 and the second conductive structure 120.

As shown in FIG. 3, the semiconductor structure 100' includes the interconnect structure 200 formed over the substrate 102'. More specifically, the first conductive structure 114' formed in the first organosilicon layer 108' and the second conductive structure 120' formed in a second organosilicon layer 118' are formed over the gate structure 201. In some embodiments, the first conductive structure 114' and the second conductive structure 120' are electrically connected to the gate structure 201.

Since the interconnect structure 200 includes the first conductive structure 114' formed in the first organosilicon layer 108' and the second conductive structure 120' formed in the second organosilicon layer 118', the sizes and shapes of the first conductive structure 114' and the second conductive structure 120' may be better controlled, as described previously. In addition, the dielectric constant of the first organosilicon layer 108' and the second organosilicon layer 118' may be relatively low even when some carbons are removed during the etching process, and therefore the performance of the interconnect structure 200 may be improved.

It should be noted that additional layers and/or elements may be formed between the substrate 102' and the interconnect structure 200, although they are not shown in FIG. 3, and the scope of the disclosure is not intended to be limiting.

As described previously, the semiconductor structure includes the first organosilicon layer 108 (or 108') and the first conductive structure 114 (or 114') formed in the first organosilicon layer 108. In addition, the first organosilicon layer 108 is a carbon-rich low dielectric layer. Generally, when the dielectric layer is etched, carbons in the dielectric layer may be removed by the etchant, and therefore the dielectric layer may be damaged and the dielectric constant may be increased. However, since the first organosilicon layer 108 is carbon-rich, the dielectric constant of the first organosilicon layer 108 can still be relatively low after performing an etching process, even when some carbons therein are removed by the etchant used in the etching process. In addition, the shape and the size of the first conductive structure 114 formed in the trench 110 of the first organosilicon layer 108 can be better controlled.

Furthermore, in some embodiments, pores 109 are formed in the first organosilicon layer 108, as shown in FIG. 2. The formation of the pores 109 may further improve (i.e. lower) the dielectric constant of the first organosilicon layer 108. The pores 109 can be formed by adding the $C_3$ to $C_5$ cyclic compound in the precursor material and then removing the $C_3$ to $C_5$ cyclic compound by curing. The pore size may be controlled by selecting the size of the $C_3$ to $C_5$ cyclic compound, so that the pore size can be large enough to reduce the dielectric constant of the resulting first organosilicon layer 108 while not being too large so that the first organosilicon layer 108 will not be easily damaged during subsequent etching processes.

Embodiments of a semiconductor structure and methods for forming the same are provided. The semiconductor structure includes forming an organosilicon layer over a substrate and a conductive structure in the organosilicon layer. The organosilicon layer is relatively carbon-rich, and therefore the dielectric constant of the organosilicon layer can remain relatively low even when carbons are removed during an etching process performed afterwards. In addition, the organosilicon layer may be formed by depositing a precursor material over the substrate, and curing the precursor material afterwards. The precursor material may include an organosilicon material and a $C_3$ to $C_5$ cyclic compound. The $C_3$ to $C_5$ cyclic compound may be chosen to have a suitable size, so that pores having suitable sizes can be formed in the organosilicon layer.

In some embodiments, a method for manufacturing a semiconductor structure is provided. The method for manufacturing a semiconductor structure includes forming an organosilicon layer over a substrate and etching the organosilicon layer to have a trench. The method for manufacturing a semiconductor structure further includes forming a conductive structure in the trench. In addition, the organosilicon layer is made of a material comprising Si—C bonding and Si—O bonding, and the ratio of the amount of Si—C bonding to the amount of Si—O bonding is greater than about 0.2.

In some embodiments, a method for manufacturing a semiconductor structure is provided. The method for manufacturing a semiconductor structure includes depositing a precursor material over a substrate and curing the precursor material to form an organosilicon layer. The method for manufacturing a semiconductor structure further includes etching the dielectric layer to form a trench and forming a conductive structure in the trench. In addition, the precursor material comprises an organosilicon material and a $C_3$ to $C_5$ cyclic compound, and the $C_3$ to $C_5$ cyclic compound is removed when the precursor material is cured.

In some embodiments, a semiconductor structure is provided. The semiconductor structure includes a substrate and a device region formed in the substrate. The semiconductor structure further includes an organosilicon layer formed over the device region and a conductive structure formed in the organosilicon layer. The semiconductor structure further includes the organosilicon layer being made of a material comprising Si—C bonding and Si—O bonding, and the ratio of the amount of Si—C bonding to the amount of Si—O bonding being greater than about 0.2.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
   forming an organosilicon layer over a substrate;
   etching the organosilicon layer to form a trench; and
   forming a conductive structure in the trench,
   wherein the organosilicon layer is made of a material comprising Si—C bonding and Si—O bonding, and a ratio of an amount of the Si—C bonding to an amount of the Si—O bonding is greater than about 0.2.

2. The method for manufacturing a semiconductor structure as claimed in claim 1, wherein the ratio of the amount of the Si—C bonding to the amount of the Si—O bonding is in a range of about 0.2 to about 0.25.

3. The method for manufacturing a semiconductor structure as claimed in claim 1, wherein forming an organosilicon layer further comprises:
   forming a precursor material over the substrate; and
   curing the precursor material to form the organosilicon layer having pores.

4. The method for manufacturing a semiconductor structure as claimed in claim 3, wherein the precursor material comprises an organosilicon material and a $C_3$ to $C_5$ cyclic compound, and the $C_3$ to $C_5$ cyclic compound is removed when the precursor material is cured.

5. The method for manufacturing a semiconductor structure as claimed in claim 4, wherein the $C_3$ to $C_5$ cyclic compound comprises substituted or non-substituted $C_3$ to $C_5$ cycloalkane, substituted or non-substituted $C_3$ to $C_5$ cycloalkene, or combinations thereof.

6. The method for manufacturing a semiconductor structure as claimed in claim 1, wherein the conductive structure has a first width at its top surface and has a second width at its bottom surface, and a ratio of the first width to the second width is smaller than 1.4.

7. The method for manufacturing a semiconductor structure as claimed in claim 1, wherein a device region is formed in the substrate, and the conductive structure is electrically connected to a transistor formed in the device region.

8. A method for manufacturing an interconnect structure, comprising:
   depositing a precursor material over a substrate;
   curing the precursor material to form an organosilicon layer;
   etching the organosilicon layer to form a trench; and
   forming a conductive structure in the trench,
   wherein the precursor material comprises an organosilicon material and a $C_3$ to $C_5$ cyclic compound, and the $C_3$ to $C_5$ cyclic compound is removed when the precursor material is cured.

9. The method for manufacturing a semiconductor structure as claimed in claim 8, wherein the organosilicon material is $Si_xC_yO_z$, and a ratio of y to z is in a range from about 0.25 to about 1.

10. The method for manufacturing a semiconductor structure as claimed in claim 8, wherein the organosilicon material comprises Si—C bonding and Si—O bonding, and a ratio of an amount of the Si—C bonding to an amount of the Si—O bonding is greater than about 0.2.

11. The method for manufacturing a semiconductor structure as claimed in claim 8, wherein a number of pores are formed in the organosilicon layer.

12. The method for manufacturing a semiconductor structure as claimed in claim 8, wherein the $C_3$ to $C_5$ cyclic compound comprises substituted or non-substituted $C_3$ to $C_5$ cycloalkane, substituted or non-substituted $C_3$ to $C_5$ cycloalkene, or combinations thereof.

13. The method for manufacturing a semiconductor structure as claimed in claim 10, wherein the ratio of an amount of the Si—C bonding to an amount of the Si—O bonding is in a range of about 0.2 to about 0.25.

14. The method for manufacturing a semiconductor structure as claimed in claim 8, wherein some carbons at sidewalls of the trench are removed when the organosilicon layer is etched to form the trench.

15. The method for manufacturing a semiconductor structure as claimed in claim 8, wherein the conductive structure has a first width at its top surface and has a second width at its bottom surface, and a ratio of the first width to the second width is smaller than 1.4.

16. A semiconductor structure, comprising:
   a substrate;
   a device region formed in the substrate;
   an organosilicon layer formed over the device region; and
   a conductive structure formed in the organosilicon layer,
   wherein the organosilicon layer is made of a material comprising Si—C bonding and Si—O bonding, and a ratio of an amount of the Si—C bonding to an amount of the Si—O bonding is greater than about 0.2.

17. The semiconductor structure as claimed in claim 16, wherein the organosilicon layer has a number of pores, and a size of one pore is substantially equal to a size of a $C_3$ to $C_5$ cyclic compound.

18. The semiconductor structure as claimed in claim 17, wherein the $C_3$ to $C_5$ cyclic compound comprises substituted or non-substituted $C_3$ to $C_5$ cycloalkane, substituted or non-substituted $C_3$ to $C_5$ cycloalkene, or combinations thereof.

19. The semiconductor structure as claimed in claim 16, wherein the ratio of an amount of the Si—C bonding to an amount of the Si—O bonding is in a range of about 0.2 to about 0.25.

20. The semiconductor structure as claimed in claim 16, wherein the conductive structure has a first width at its top surface and has a second width at its bottom surface, and a ratio of the first width to the second width is smaller than 1.4.

* * * * *